(12) United States Patent
Gulliver et al.

(10) Patent No.: US 6,222,420 B1
(45) Date of Patent: Apr. 24, 2001

(54) MINIMIZING RECOVERY TIME

(75) Inventors: William H. Gulliver; Lance A. Marten, both of Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/660,747

(22) Filed: Sep. 13, 2000

Related U.S. Application Data

(63) Continuation of application No. 09/128,025, filed on Aug. 3, 1998, now Pat. No. 6,150,889.

(51) Int. Cl.[7] .............................. H03L 7/06; H03L 7/10; H03L 7/089
(52) U.S. Cl. .............................. 331/14; 331/1 A; 331/18; 331/25; 327/142; 327/156; 327/159
(58) Field of Search .................................. 331/1 AL, 14, 331/16, 17, 18, 25, DIG. 2; 327/142, 143, 156–159

(56) References Cited

U.S. PATENT DOCUMENTS

| 4,970,475 | 11/1990 | Gillig | 331/25 |
|---|---|---|---|
| 5,339,278 | 8/1994 | Irwin et al. | 331/16 |
| 5,581,214 | 12/1996 | Iga | 331/16 |
| 5,592,113 | 1/1997 | Quiet et al. | 327/158 |
| 5,663,665 | * 9/1997 | Wang et al. | 327/3 |
| 6,084,479 | * 7/2000 | Duffy et al. | 331/17 |
| 6,150,889 | * 11/2000 | Gulliver et al. | 331/14 |
| 6,154,508 | * 11/2000 | Ott | 375/354 |

* cited by examiner

Primary Examiner—David Mis
(74) Attorney, Agent, or Firm—Anthony M. Martinez

(57) ABSTRACT

A circuit (70) includes a reset stage (72) and a Phase-Locked Loop (PLL) device (73). The PLL device (73) includes a phase detector (74), a charge pump (75), a filter (76), and a Voltage-Controlled Oscillator (77). The reset stage (72) receives a reference signal and is connected to the phase detector (74). The phase detector (74) receives the reference signal and a feedback signal. When the reference signal switches from a first clock signal to a second clock signal, the reset stage (72) places the phase detector (74) in an inactive state until the reset stage (72) detects a falling edge in the reference signal.

18 Claims, 4 Drawing Sheets

FIG. 1 —PRIOR ART—

MINIMIZING RECOVERY TIME

The present application is a continuation of U.S. application Ser. No. 09/128,025, filed on Aug. 3, 1998, U.S. Pat. No. 6,150,889, which is hereby incorporated by reference, and priority thereto for common subject matter is hereby claimed.

FIELD OF THE INVENTION

The present invention relates, in general, to integrated circuits and, more particularly, to Phase-Locked Loop (PLL) devices.

BACKGROUND OF THE INVENTION

Communications systems and computer systems have components that operate at different frequencies. Typically, these systems use Phase-Locked Loops (PLLs) for synchronization of their components. A PLL generally includes a phase detector, a loop filter, a Voltage-Controlled Oscillator (VCO), and a loop divider. The phase detector receives a reference clock signal and a loop clock signal and provides a phase detect output signal that indicates the phase difference between the loop clock signal and the reference clock signal. The phase detector provides the phase detect output signal to an input of the loop filter, which in turn provides a filtered signal to the VCO. The filtered signal indicates the length of time that the two clock signals are out of phase. The VCO provides a clock output signal having a desired frequency. The clock output signal is divided by the loop divider to provide the loop clock signal.

In some systems, it is desirable to switch the reference clock signal between one of two clock signals, i.e., a primary clock signal and a backup clock signal. A multiplexer is used to switch between the two clock signals. During normal operation, the primary clock signal serves as the reference clock signal. In the event of a failure of the primary clock signal, the select input of the multiplexer is toggled such that the backup clock signal becomes the reference clock signal. If the primary clock signal and backup clock signal are out of phase, then the PLL changes the frequency of its output signal to regain phase lock to the new reference clock signal, i.e., the backup clock signal.

The switch between the primary clock signal and the backup clock signal is asynchronous. Therefore, the recovery time of the PLL, i.e., the time it takes for the PLL to regain phase lock, is variable and unpredictable. This is not desirable in systems employing multiple PLLs since it can cause a loss of synchronization. The loss of synchronization between components of these systems can lead to race conditions, code execution failure, improper turning on or turning off of buses, etc.

Accordingly, it would be advantageous to have a PLL device and a method for regaining phase lock in a predictable manner. It would be of further advantage to have a PLL device and method that minimizes the amount of time it takes for the PLL device to regain phase lock.

DETAILED DESCRIPTION OF THE DRAWINGS

Generally, the present invention provides a circuit comprising a reset stage coupled to a Phase-Locked Loop (PLL) device. More particularly, the reset stage is coupled to a phase detector of the PLL device in order to minimize the recovery time of the PLL device. The recovery time is the amount of time it takes for the PLL device to regain phase lock after the reference input terminal of the PLL device switches from an initial reference signal to a new reference signal.

The reset stage provides a reset signal to the phase detector, which is reset in accordance with the logic value of the reset signal. When the reference input terminal of the PLL device switches from the initial reference signal to the new reference signal, the reset stage places the phase detector in an inactive state until the reset stage detects a falling edge of the new reference signal. This is accomplished by asserting the reset input of the phase detector, thereby setting the output terminals of the phase detector to a predetermined state. Upon detecting the first falling edge of the new reference signal after the signal at the reference input terminal switches, the reset stage deasserts the reset input of the phase detector, resulting in the PLL device regaining phase lock in a predictable manner.

Figure 1:
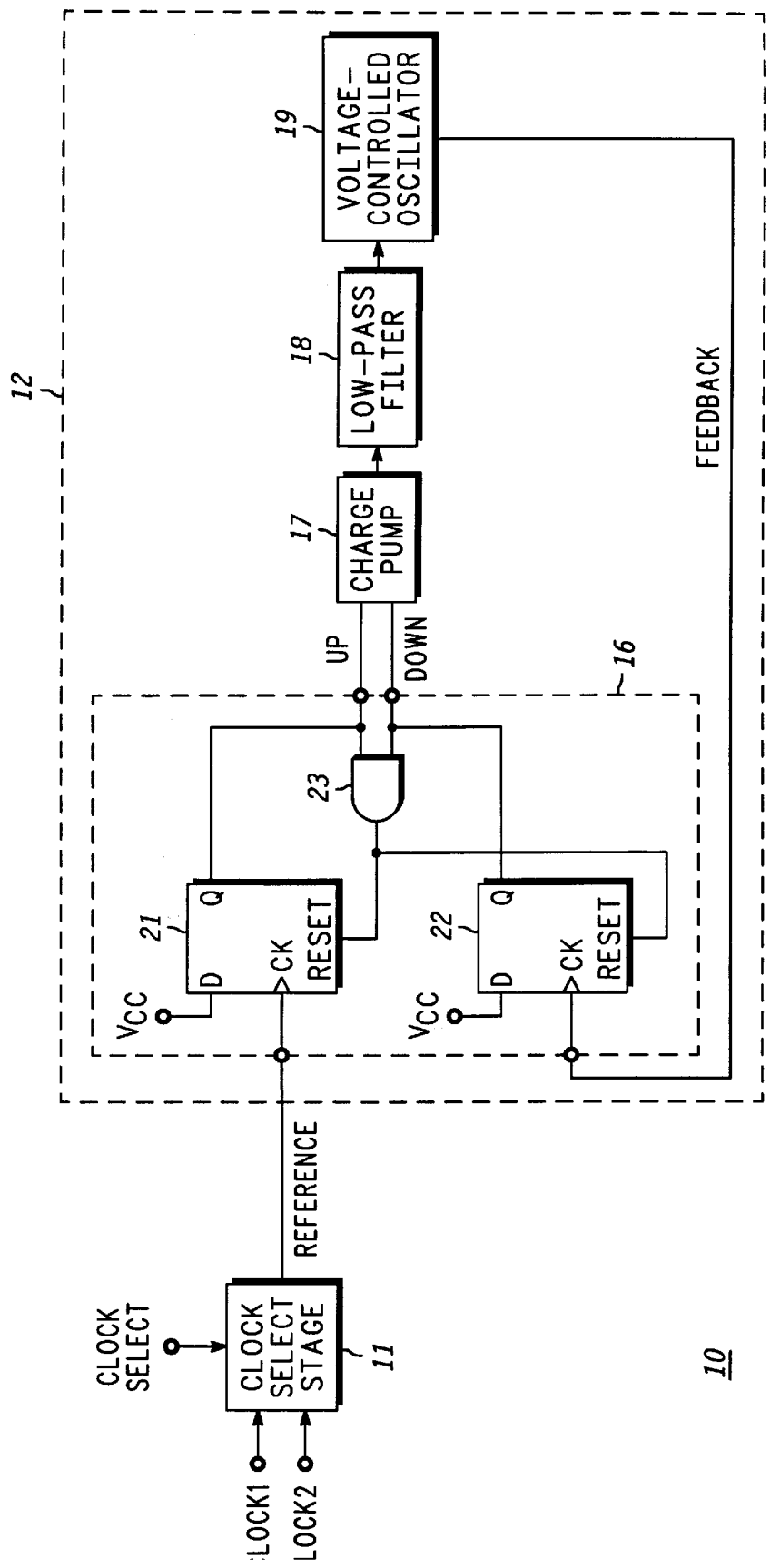
FIG. 1 is a block diagram of a prior art PLL device.

FIG. 1 is a block diagram of a prior art circuit 10. Circuit 10 includes a clock select stage 11 connected to a PLL device 12. PLL device 12 includes a phase detector 16, a charge pump 17, a low-pass filter 18, and a Voltage-Controlled Oscillator (VCO) 19. Clock select stage 11 has a first clock input terminal for receiving a clock signal labeled CLOCK1, a second clock input terminal for receiving a clock signal labeled CLOCK2, a clock select input terminal for receiving a clock select signal labeled CLOCK SELECT, and an output terminal for providing a reference signal labeled REFERENCE. Phase detector 16 has a reference input terminal connected to the output terminal of clock select stage 11, a feedback input terminal connected to the output terminal of VCO 19, a first output terminal for providing an up signal labeled UP, and a second output terminal for providing a down signal labeled DOWN. Charge pump 17 has a first input terminal connected to the first output terminal of phase detector 16, a second input terminal connected to the second output terminal of phase detector 16, and an output terminal connected to an input terminal of low-pass filter 18. The output terminal of low-pass filter 18 is connected to the input terminal of VCO 19 and the output terminal of VCO 19 is connected to the feedback input terminal of phase detector 16 for providing a feedback signal labeled FEEDBACK.

Phase detector 16 includes two D-type flip-flops 21 and 22 and an AND gate 23. D-type flip-flops 21 and 22 each have a data input terminal labeled D, a true clock input terminal labeled CK, a reset input terminal labeled RESET, and a true output terminal labeled Q. Terminal D of flip-flop 21 is coupled for receiving a source of operating potential or power supply voltage such as, for example, a voltage labeled Vcc. Input terminal CK of flip-flop 21 is connected to the reference input terminal of phase detector 16 and output terminal Q of flip-flop 21 is commonly connected to the first output terminal of phase detector 16 and to the first input terminal of AND gate 23.

Terminal D of flip-flop 22 is coupled for receiving a power supply voltage such as, for example, voltage Vcc. Input terminal CK of flip-flop 22 is connected to the feedback input terminal of phase detector 16 and output terminal Q of flip-flop 22 is commonly connected to the second input terminal of AND gate 23 and to the second output terminal of phase detector 16. The output terminal of AND gate 23 is commonly connected to a terminal RESET of flip-flop 21 and to a terminal RESET of flip-flop 22.

Referring again to clock select stage 11, signal CLOCK SELECT is used for selecting one clock signal of a plurality of clock signals to serve as signal REFERENCE. For example, when signal CLOCK SELECT is at a logic low voltage, signal CLOCK1 serves as signal REFERENCE, i.e., signal CLOCK1 is transmitted from the first clock input terminal of clock select stage 11 to the output terminal of clock select stage 11. Alternatively, when signal CLOCK SELECT is at a logic high voltage, signal CLOCK2 serves as signal REFERENCE, i.e., signal CLOCK2 is transmitted from the second clock input terminal of clock select stage 11 to the output terminal of clock select stage 11. As those skilled in the art are aware, a logic high voltage is also referred to as a logic high, a logic one, or a logic one signal and a logic low voltage is also referred to as a logic low, a logic zero, or a logic zero signal.

Phase detector 16 detects the phase difference between selected edges of signal REFERENCE and signal FEEDBACK. Phase detector 16 is also referred to as a Phase-Frequency Detector (PFD). When a rising edge of signal REFERENCE is detected, i.e., when signal reference transitions from a logic low to a logic high, signal UP transitions from a logic low to a logic high. Similarly, when a rising edge of signal FEEDBACK is detected, signal DOWN transitions from a logic low to a logic high. If signal REFERENCE leads signal FEEDBACK, then signal UP is at a logic high and signal DOWN is at a logic low until signal FEEDBACK transitions. If signal REFERENCE lags signal FEEDBACK, then signal UP is at a logic low and signal DOWN is at a logic high until signal REFERENCE transitions.

Charge pump 17 transmits a charge pump signal to filter 18. Filter 18 generates a Direct Current (DC) signal by filtering out the Alternating Current (AC) component of the charge pump signal leaving only the DC component of the charge pump signal. The DC signal is transmitted to the input terminal of VCO 19 from the output terminal of filter 18.

The magnitude of the DC signal is adjusted in accordance with the phase difference between signal REFERENCE and signal FEEDBACK. If signal REFERENCE leads signal FEEDBACK, then the magnitude of the DC signal is increased. On the other hand, if signal REFERENCE lags signal FEEDBACK, then the magnitude of the DC signal is decreased. VCO 19 generates signal FEEDBACK in response to the DC signal. As is well known, changing the magnitude of the DC signal transmitted to VCO 19 changes the frequency of signal FEEDBACK. PLL device 12 changes the frequency of signal FEEDBACK until signal REFERENCE and signal FEEDBACK have essentially the same frequency and phase, i.e., signal FEEDBACK is "locked" to signal REFERENCE.

Figure 2:
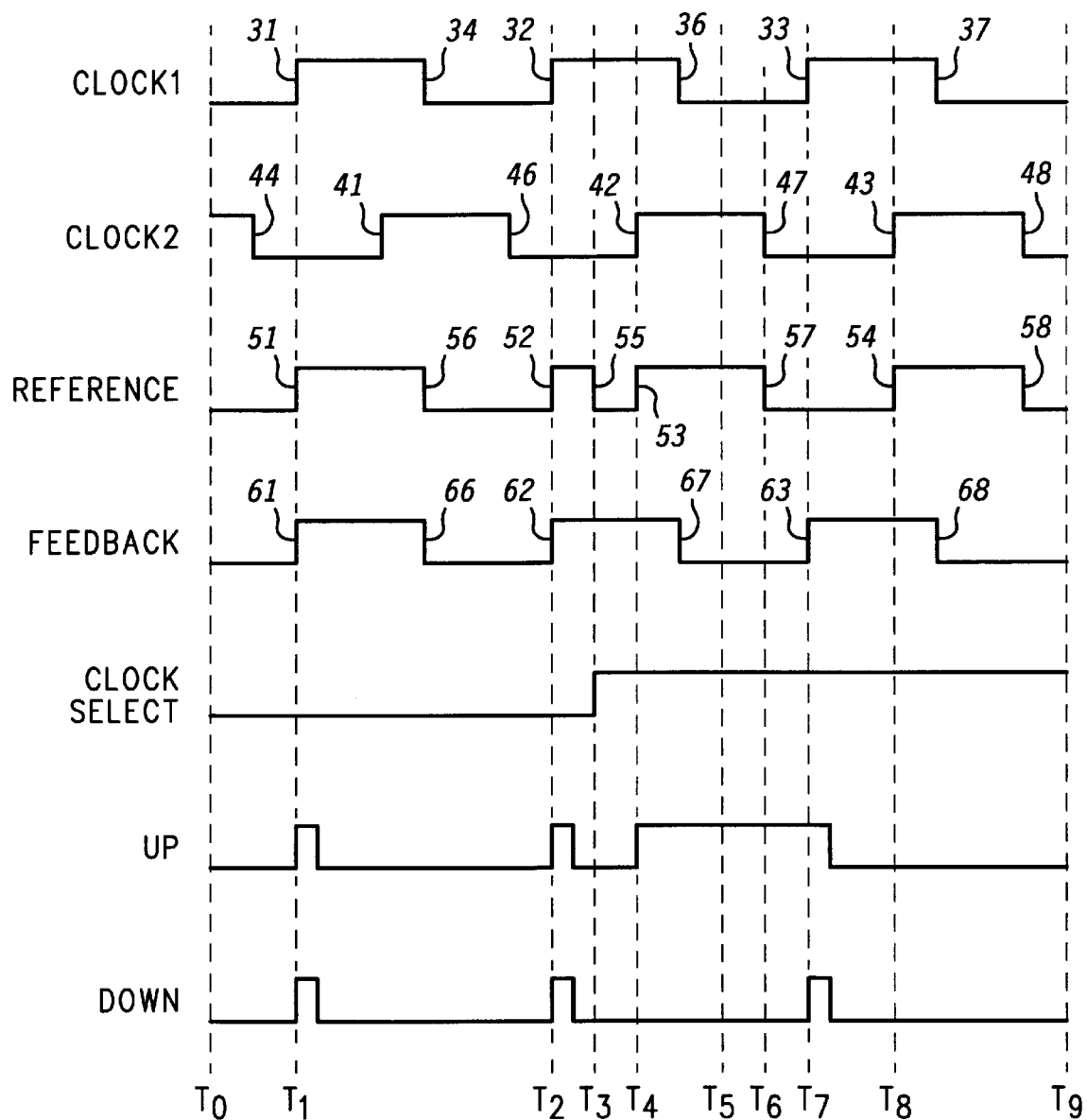
FIG. 2 is a timing diagram illustrating the signals received and generated by the PLL device of FIG. 1.

The operation of circuit 10 is further described with reference to FIG. 2. FIG. 2 is a timing diagram 30 illustrating the signals received and generated by circuit 10 (FIG. 1). Signal CLOCK1 has rising edges 31, 32, and 33 and falling edges 34, 36, and 37, and signal CLOCK2 has rising edges 41, 42, and 43 and falling edges 44, 46, 47, and 48. In addition, signal REFERENCE has rising edges 51, 52, 53, and 54 and falling edges 55, 56, 57, and 58, and signal FEEDBACK has rising edges 61, 62, and 63 and falling edges 66, 67, and 68.

Between times $T_0$ and $T_3$, signal CLOCK SELECT is at a logic low and signal CLOCK1 serves as signal REFERENCE. Between times $T_3$ and $T_9$, signal CLOCK SELECT is at a logic high and signal CLOCK2 serves as signal REFERENCE. It should be noted that falling edge 55 is a result of the switching of signal REFERENCE. Between times $T_0$ and $T_3$, signal REFERENCE and signal FEEDBACK are phase locked, i.e., the rising and falling edges of signals REFERENCE and FEEDBACK are aligned to each other. In particular, rising edges 61 and 62 of signal FEEDBACK are aligned to rising edges 51 and 52 of signal REFERENCE, respectively, and falling edge 66 is aligned to falling edge 56. Between times $T_3$ and $T_9$, signal REFERENCE and signal FEEDBACK are not phase locked.

At time $T_1$, signals UP and DOWN transition from a logic low to a logic high and the output of AND gate 23 (FIG. 1) transitions from a logic low to a logic high. After a time delay introduced by AND gate 23, flip-flops 21 and 22 are reset and signals UP and DOWN transition from a logic high to a logic low. Similarly, at time $T_2$, signals UP and DOWN transition from a logic low to a logic high and flip-flops 21 and 22 are reset so that signals UP and DOWN transition from a logic high to a logic low.

At time $T_3$, signal CLOCK SELECT transitions from a logic low to a logic high and signal CLOCK2 serves as signal REFERENCE. At time $T_4$, signal REFERENCE transitions from a logic low to a logic high which causes signal UP to transition from a logic low to a logic high. At time $T_7$, signal FEEDBACK transitions from a logic low to a logic high which causes signal DOWN to transition from a logic low to a logic high. Between times $T_4$ and $T_7$, signal UP is at a logic high and signal DOWN is at a logic low. This causes charge pump 17 to source current to filter 18, thereby increasing the frequency of signal FEEDBACK. Although not shown in FIG. 2, increasing the frequency of signal FEEDBACK results in rising edge 63 of signal FEEDBACK becoming aligned to rising edge 42 of signal CLOCK2.

Figure 3:
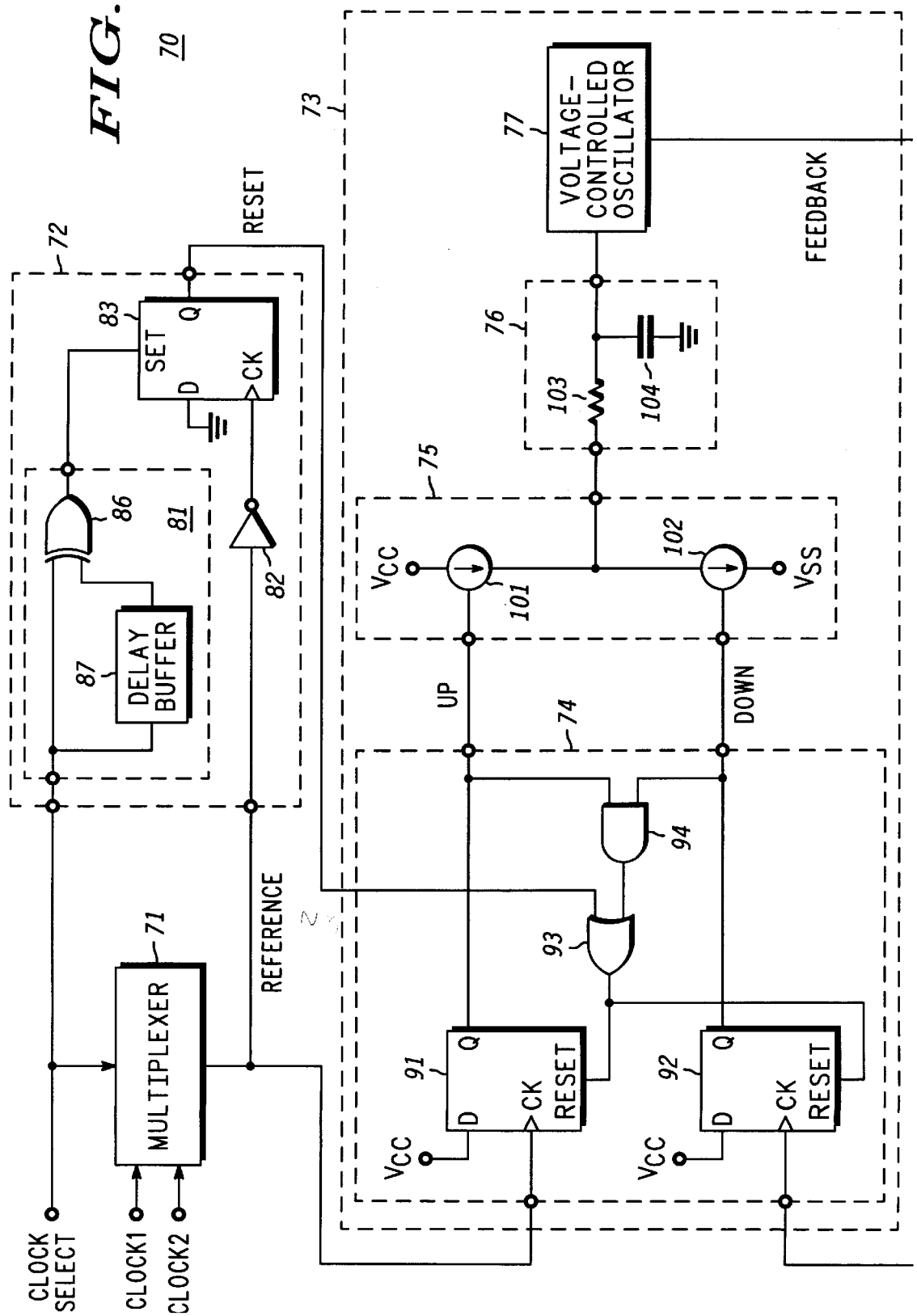
FIG. 3 illustrates in partial block diagram form and partial schematic form, a PLL device in accordance with an embodiment of the present invention.

FIG. 3 illustrates in partial block diagram form and partial schematic form, a circuit 70 in accordance with an embodiment of the present invention. Circuit 70 includes a clock select stage 71, a reset stage 72, and a PLL device 73. PLL device 73 includes a phase detector 74, a charge pump 75, a low-pass filter 76, and a VCO 77. By way of example, clock select stage 71 is a multiplexer. Multiplexer 71 has a first clock input terminal for receiving signal CLOCK1, a second clock input terminal for receiving signal CLOCK2, a clock select input terminal for receiving signal CLOCK SELECT, and an output terminal for providing signal REFERENCE. Reset stage 72 has a first input terminal connected to the clock select input terminal of multiplexer 71, a second input terminal connected to the output terminal of multiplexer 71, and an output terminal. Phase detector 74 has a reference input terminal commonly connected to the output terminal of multiplexer 71 and to the second input terminal of reset stage 72, a feedback input terminal connected to the output terminal of VCO 77, a reset input terminal connected to the output terminal of reset stage 72, a first output terminal for providing signal UP, and a second output terminal for providing signal DOWN. Charge pump 75 has a first input terminal connected to the first output terminal of phase detector 74, a second input terminal connected to the second output terminal of phase detector 74, and an output terminal connected to an input terminal of low-pass filter 76. The output terminal of low-pass filter 76 is connected to the input terminal of VCO 77 and the output terminal of VCO 77 is connected to the second input terminal of phase detector 74 for providing signal FEEDBACK to phase detector 74.

Reset stage 72 includes a one-shot circuit 81, an inverter 82, and a D-type flip-flop 83. The first input terminal of reset stage 72 is connected to the input terminal of one-shot circuit 81 and the output terminal of one-shot circuit 81 is connected to terminal SET of flip-flop 83. Terminal Q of flip-flop 83 is connected to the output terminal of reset stage 72 and terminal D of flip-flop 83 is coupled for receiving a power supply voltage or source of operating potential such as, for example, ground potential. The input terminal of inverter 82 is connected to the second input terminal of reset stage 72 and the output terminal of inverter 82 is connected to terminal CK of flip-flop 83.

One-shot circuit 81 is comprised of an exclusive-OR (XOR) gate 86 and a delay buffer 87. The first input terminal of XOR gate 86 is commonly connected to the input terminal of delay buffer 87 and to the input terminal of one-shot circuit 81. The second input terminal of XOR gate 86 is connected to the output terminal of delay buffer 87 and the output terminal of XOR gate 86 is connected to the output terminal of one-shot circuit 81.

Reset stage 72 provides a reset signal labeled RESET to the reset input of phase detector 74. Signal RESET is set to a logic high or a logic low in accordance with the logic level of signals CLOCK SELECT and REFERENCE. Reset stage 72 monitors signals CLOCK SELECT and REFERENCE and sets signal RESET to, for example, a logic high when signal CLOCK SELECT transitions from a logic low to a logic high.

Phase detector 74 includes two D-type flip-flops 91 and 92, an OR gate 93, and an AND gate 94. Terminal D of flip-flop 91 is coupled for receiving a source of operating potential or power supply voltage such as, for example, a voltage Vcc. Input terminal CK of flip-flop 91 is connected to the reference input terminal of phase detector 74 and output terminal Q of flip-flop 91 is commonly connected to the first output terminal of phase detector 74 and to the first input terminal of AND gate 94.

Terminal D of flip-flop 92 is coupled for receiving a power supply voltage such as, for example, voltage Vcc. Input terminal CK of flip-flop 92 is connected to the feedback input terminal of phase detector 74 and output terminal Q of flip-flop 92 is commonly connected to the second input terminal of AND gate 94 and to the second output terminal of phase detector 74. The first input terminal of OR gate 93 is connected to the reset input terminal of phase detector 74 and the second input terminal of OR gate 93 is connected to the output terminal of AND gate 94. The output terminal of OR gate 93 is commonly connected to a terminal RESET of flip-flop 91 and to a terminal RESET of flip-flop 92.

Charge pump 75 includes two current sources 101 and 102. The first input terminal of current source 101 is connected to the first input terminal of charge pump 75 and the second input terminal of current source 101 is coupled for receiving a power supply voltage such as, for example, voltage Vcc. The output terminal of current source 101 is commonly connected to the output terminal of charge pump 75 and to the output terminal of current source 102. The first input terminal of current source 102 is connected to the second input terminal of charge pump 75 and the second input terminal of current source 102 is coupled for receiving a power supply voltage such as, for example, a voltage Vss. The first input terminals of current sources 101 and 102 are also referred to as enable input terminals. When signal UP is at a logic high and signal DOWN is at a logic low, current source 101 is enabled which results in charge pump 75 supplying or sourcing current to filter 76, thereby increasing the frequency of signal FEEDBACK. When signal DOWN is at a logic high and signal UP is at a logic low, current source 102 is enabled which results in charge pump 75 removing or sinking current from filter 76, thereby decreasing the frequency of signal FEEDBACK. If signals UP and DOWN are at a logic high, then there is no change to the frequency of signal FEEDBACK.

Low-pass filter 76 includes a resistor 103 and a capacitor 104. The first terminal of resistor 103 is connected to the input terminal of filter 76 and the second terminal of resistor 103 is commonly connected to the output terminal of filter 76 and to the first terminal of capacitor 104. The second terminal of capacitor 104 is coupled for receiving a source of operating potential such as, for example, ground potential.

Figure 4:
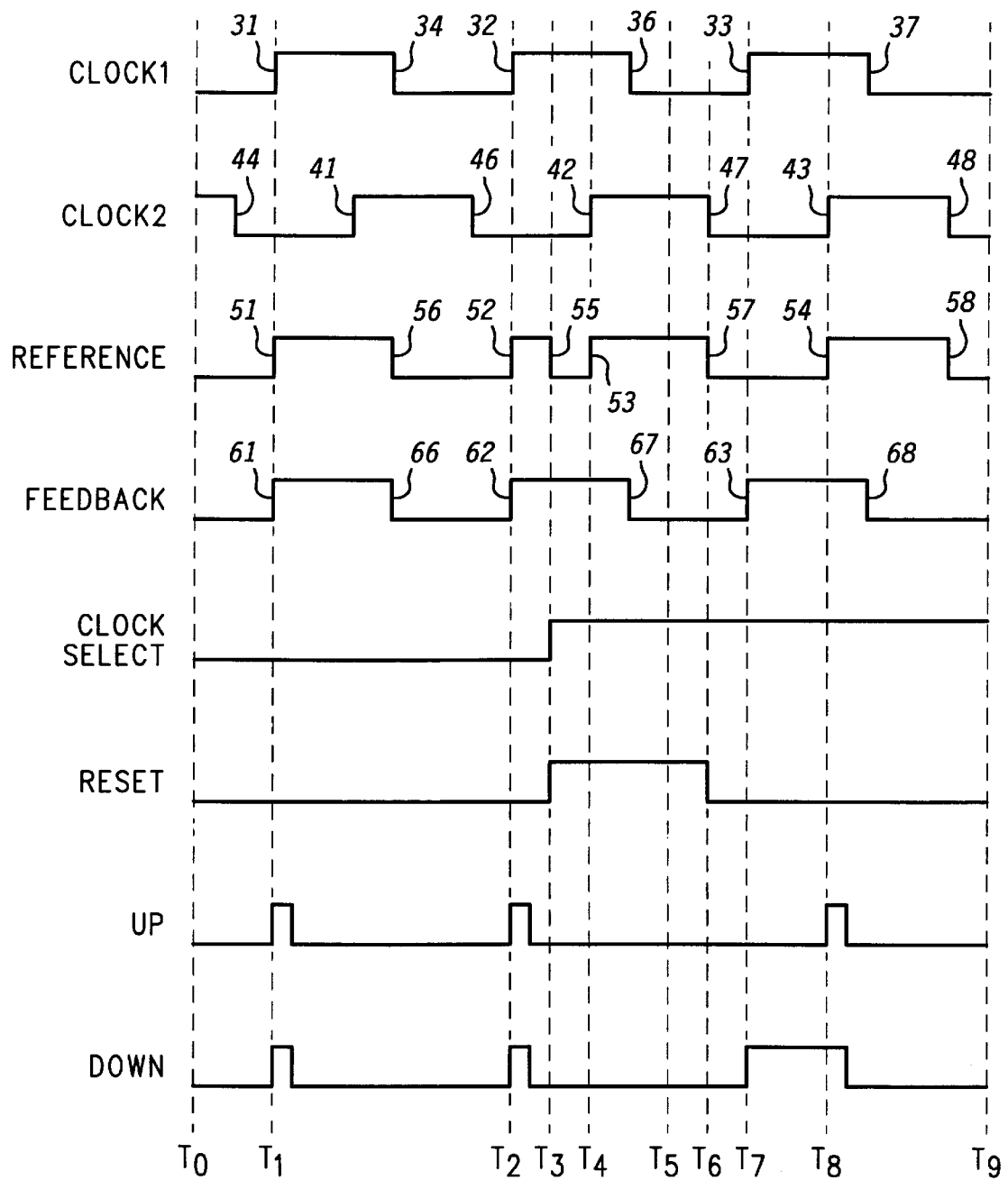
FIG. 4 is a timing diagram illustrating the signals received and generated by the PLL device of FIG. 3.

The operation of circuit 70 is further described with reference to FIG. 4. FIG. 4 is a timing diagram 110 illustrating the signals received and generated by circuit 70 (FIG. 3). Times $T_0$–$T_9$ of FIG. 4 correspond to times $T_0$–$T_9$ of FIG. 2. Further, signals CLOCK1, CLOCK2, REFERENCE, FEEDBACK, and CLOCK SELECT of FIG. 4 correspond to signals CLOCK1, CLOCK2, REFERENCE, FEEDBACK, and CLOCK SELECT of FIG. 2.

Between times $T_0$ and $T_3$, signal CLOCK SELECT is at a logic low, signal CLOCK1 serves as signal REFERENCE, and signal RESET is at a logic low. At time $T_1$, signals UP and DOWN transition from a logic low to a logic high and the output of AND gate 94 (FIG. 3) transitions from a logic low to a logic high. This causes the output of OR gate 93 to transition from a logic low to a logic high, thereby resetting flip-flops 91 and 92 so that signals UP and DOWN transition from a logic high to a logic low. Similarly, at time $T_2$, signals UP and DOWN transition from a logic low to a logic high and flip-flops 91 and 92 are reset so that signals UP and DOWN transition from a logic high to a logic low.

At time $T_3$, signal CLOCK SELECT transitions from a logic low to a logic high and one-shot circuit 81 generates a pulse having a logic value of a logic high and a pulse width equal to the time delay of delay buffer 87. The pulse is transmitted to terminal SET of flip-flop 83 and causes signal RESET to transition from a logic low to a logic high. Signal RESET is transmitted to terminal RESET of flip-flop 91 and terminal RESET of flip-flop 92 via OR gate 93, thereby resetting flip-flops 91 and 92. Signals UP and DOWN are at a logic low when signal RESET is at a logic high. When signal RESET is at a logic high, phase detector 74 is in an inactive state, i.e., phase detector 74 is deactivated. Therefore, at time $T_4$, flip-flop 91 does not clock the signal at terminal D to terminal Q in response to rising edge 53 of signal REFERENCE. In other words, if signal RESET is at a logic high, then signal UP from terminal Q of flip-flop 91 remains at a logic low when a rising edge is detected at terminal CK of flip-flop 91. Flip-flop 83 triggers on a falling or negative edge of signal REFERENCE because of inverter 82. At time $T_6$, falling edge 57 of signal REFERENCE causes signal RESET to transition from a logic high to a logic low. Although reset stage 72 is shown as including inverter 82, this is not a limitation of the present invention. Alternatively, flip-flop 83 can be a negative edge triggered flop-flop having a negative edge triggered clock input terminal connected to the second input of reset stage 72.

At time $T_7$, rising edge 63 of signal FEEDBACK causes signal DOWN to transition from a logic low to a logic high. At time $T_8$, signal REFERENCE transitions from a logic low to a logic high which causes signal UP to transition from a logic low to a logic high. Between times $T_7$ and $T_8$, signal UP is at a logic low and signal DOWN is at a logic high. This cause charge pump 17 to sink current from filter 18, thereby decreasing the frequency of signal FEEDBACK. Although not shown, decreasing the frequency of signal FEEDBACK results in rising edge 62 of signal FEEDBACK becoming aligned to rising edge 42 of signal CLOCK2.

If signals CLOCK1 and CLOCK2 have duty cycles of 50%, then the amount of time PLL device 73 takes to regain phase lock after signal CLOCK SELECT transitions from a logic low to a logic high is minimized. This is accomplished by reset stage 72 placing phase detector 74 in its inactive state until the next falling edge of the new clock signal, i.e., signal CLOCK2. The amount of time between times $T_4$ and $T_7$ is greater than the amount of time between times $T_7$ and $T_8$, and the amount of time between times $T_2$ and $T_4$ is less than the amount of time between times $T_4$ and $T_7$. Between times $T_4$ and $T_7$, signal UP of circuit 10 (FIG. 1) causes a larger change in the frequency of signal FEEDBACK than does signal DOWN of circuit 70 (FIG. 3) between times $T_7$ and $T_8$. Thus, reset stage 72 of circuit 10 reduces the amount of time it takes for PLL device 73 to regain phase lock compared to PLL device 12 of circuit 10. This is further illustrated by comparing the amount of time it takes to align rising edge 62 of signal FEEDBACK to rising edge 42 of signal CLOCK2 (the amount of time between times $T_2$ and $T_4$) to the amount of time it takes to align rising edge 63 of signal FEEDBACK to rising edge 42 of signal CLOCK2 (the amount of time between times $T_4$ and $T_7$), i.e., it takes less time to align rising edge 62 to rising edge 42.

In another example (not shown), if signal CLOCK SELECT transitions from a logic low to a logic high at time $T_5$, then signals UP and DOWN of circuit 70 would have the same characteristics as illustrated in FIG. 4, i.e., between times $T_7$ and $T_8$, signal UP is at a logic low and signal DOWN is at a logic high. This causes charge pump 17 to sink current from filter 18, thereby decreasing the frequency of signal FEEDBACK which causes rising edge 62 of signal FEEDBACK to align to rising edge 42 of signal CLOCK2. On the other hand, if signal CLOCK SELECT transitions from a logic low to a logic high at time $T_5$. signals UP and DOWN of circuit 10 would have different characteristics from those illustrated in FIG. 2. In this example, rising edge 62 of signal FEEDBACK becomes aligned to rising edge 42 of signal CLOCK2 instead of aligning rising edge 63 to rising edge 42.

Circuit 70 is consistent in aligning a rising edge of signal FEEDBACK to the nearest rising edge of signal REFERENCE, i.e., signal CLOCK2 after signal SELECT CLOCK transitions. In other words, PLL device 73 of circuit 70 regains phase lock in a predictable manner. For example, when signal CLOCK SELECT of circuit 70 transitions at time $T_3$, rising edge 62 is aligned to rising edge 42 instead of rising edge 63 becoming aligned to rising edge 42. If signal CLOCK SELECT of circuit 70 transitions at time $T_5$, then rising edge 62 is again aligned to rising edge 42.

Circuit 10 of FIG. 1 may or may not align to the nearest edge of signal CLOCK2 depending on when signal CLOCK SELECT transitions. For example, when signal CLOCK SELECT of circuit 10 transitions at time $T_3$, rising edge 63 is aligned to rising edge 42 instead of rising edge 62 becoming aligned to rising edge 42. If signal CLOCK SELECT transitions at time $T_5$, then rising edge 62 is aligned to rising edge 42.

By now it should be appreciated that a Phase-Locked Loop (PLL) device and a method for minimizing the recovery time of the PLL device have been provided. Unlike prior art PLL devices, the PLL device of the present invention regains phase lock in a predictable manner.

What is claimed is:

1. A circuit, comprising:
    a clock select stage having a first input, a second input, and an output;
    a phase-locked loop having a first input and a second input, wherein the first input of the phase-locked loop is coupled to the output of the clock select stage; and
    a reset stage having an input and an output, wherein the input of the reset stage is coupled to the output of the clock select stage and the output of the reset stage is coupled to the second input of the phase-locked loop.

2. The circuit of claim 1, wherein the phase-locked loop comprises:
    a phase detector having a first input coupled to the output of the clock select stage, a second input, a third input coupled to the output of the reset stage, a first output, and a second output;
    a charge pump having a first input coupled to the first output of the phase detector, a second input coupled to the second output of the phase detector, and an output;
    a filter having an input coupled to the output of the charge pump and an output; and
    a Voltage-Controlled Oscillator (VCO) having an input coupled to the output of the filter and an output coupled to the second input of the phase detector.

3. The circuit of claim 1, wherein the reset stage comprises:
    a one-shot circuit having an input coupled to a second input of the reset stage and an output; and
    a flip-flop having a first input coupled to the output of the one-shot circuit, a second input coupled for receiving a source of operating potential, a third input coupled to the input of the reset stage, and an output coupled to the output of the reset stage.

4. The circuit of claim 3, wherein the flip-flop is a D-type flip-flop.

5. The circuit of claim 3, further comprising an inverter, wherein the third input of the flip-flop is coupled to the input of the reset stage via the inverter.

6. The circuit of claim 3, wherein the one-shot circuit comprises:
    a delay buffer having an input coupled to the input of the one-shot circuit and an output; and
    an exclusive-OR (XOR) gate having a first input coupled to the input of the one-shot circuit, a second input coupled to the output of the delay buffer, and an output coupled to the output of the one-shot circuit.

7. The circuit of claim 2, wherein the phase detector comprises:
    a first flip-flop having a data input coupled for receiving a source of operating potential, a clock input coupled to the first input of the phase detector, a reset input, and an output coupled to the first output of the phase detector;
    a second flip-flop having a data input coupled for receiving the source of operating potential, a clock input coupled to the second input of the phase detector, a reset input, and an output coupled to the second output of the phase detector;
    an AND gate having a first input coupled to the output of the first flip-flop, a second input coupled to the output of the second flip-flop, and an output; and
    an OR gate having a first input coupled to the third input of the phase detector, a second input coupled to the output of the AND gate, and an output coupled to the reset input of the first flip-flop and the reset input of the second flip-flop.

8. The circuit of claim 7, wherein the first and second flip-flops are D-type flip flops.

9. The circuit of claim 2, wherein the charge pump comprises:
   a first current source having a first input coupled for receiving a first source of operating potential, a second input coupled to the first input of the charge pump, and an output coupled to the output of the charge pump; and
   a second current source having a first input coupled for receiving a second source of operating potential, a second input coupled to the second input of the charge pump, and an output coupled to the output of the charge pump.

10. A method for regaining phase lock between a reference signal and a feedback signal, comprising the steps of:
   deactivating a phase detector by placing the phase detector in an inactive state when a reset signal is at a first logic level so that outputs of the phase detector remain at a predetermined logic level and a frequency of the feedback signal remains unaltered during the step of deactivating; and
   activating the phase detector by placing the phase detector in an active state after the step of deactivating and the reference signal transitions from the first logic level to a second logic level.

11. The method of claim 10, further including transitioning the reset signal from the second logic level to the first logic level when a clock select signal transitions from the second logic level to the first logic level.

12. The method of claim 10, wherein activating the phase detector includes placing the phase detector in an active state after a falling edge of the reference signal is detected.

13. The method of claim 10, wherein one clock signal of a plurality of clock signals is provided to serve as the reference signal and wherein the reset signal transitions from the second logic level to the first logic level after the clock signal provided to serve as the reference signal changes from a first clock signal to a second clock signal.

14. A circuit, comprising:
   a reset stage comprising a first flip-flop having an input and an output; and
   a phase-locked loop comprising:
      a second flip-flop having a first input coupled to the input of the first flip-flop, a second input coupled to the output of the first flip-flop, and an output; and
      a third flip-flop having a first input coupled to an output of the phase-locked loop, a second input coupled to the output of the first flip-flop, and an output.

15. The circuit of claim 14, wherein the phase-locked loop further comprises:
   a charge pump having a first input coupled to the output of the second flip-flop, a second input coupled to the output of the third flip-flop, and an output;
   a filter having an input coupled to the output of the charge pump and an output; and
   an oscillator having an input coupled to the output of the filter and an output coupled to the output of the phase locked-loop.

16. The circuit of claim 14, wherein the phase-locked loop further comprises:
   a first gate having a first input coupled to the output of the second flip-flop, a second input coupled to the output of the third flip-flop, and an output; and
   an second gate having a first input coupled to the output of the first flip-flop, a second input coupled to the output of the first gate, and an output coupled to the second input of the second flip-flop and the second input of the third flip-flop.

17. The circuit of claim 16, wherein the first gate is an AND gate and the second gate is an OR gate.

18. The circuit of claim 14, wherein the second input of the second flip-flop is a reset input for resetting the output of the second flip-flop and the second input of the third flip-flop is a reset input for resetting the output of the third flip-flop.

* * * * *